(12) United States Patent
Takano et al.

(10) Patent No.: US 10,563,029 B2
(45) Date of Patent: Feb. 18, 2020

(54) RESIN COMPOSITION AND PREPREG, RESIN SHEET, LAMINATE, AND PRINTED CIRCUIT BOARD

(71) Applicant: MITSUBISHI GAS CHEMICAL COMPANY, INC., Tokyo (JP)

(72) Inventors: Yoichi Takano, Tokyo (JP); Katsuya Tomizawa, Tokyo (JP); Takashi Kubo, Tokyo (JP); Tomo Chiba, Tokyo (JP); Eisuke Shiga, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 154 days.

(21) Appl. No.: 15/738,854

(22) PCT Filed: Jul. 4, 2016

(86) PCT No.: PCT/JP2016/069748
§ 371 (c)(1),
(2) Date: Dec. 21, 2017

(87) PCT Pub. No.: WO2017/006894
PCT Pub. Date: Jan. 12, 2017

(65) Prior Publication Data
US 2018/0186952 A1 Jul. 5, 2018

(30) Foreign Application Priority Data
Jul. 6, 2015 (JP) .................. 2015-135200

(51) Int. Cl.
*C08J 5/24* (2006.01)
*C08L 79/04* (2006.01)
*C08J 5/04* (2006.01)
*H01L 23/00* (2006.01)
*B32B 5/28* (2006.01)
*C08G 73/00* (2006.01)
(Continued)

(52) U.S. Cl.
CPC ................ *C08J 5/24* (2013.01); *B32B 5/00* (2013.01); *B32B 5/02* (2013.01); *B32B 5/28* (2013.01); *B32B 15/08* (2013.01); *B32B 15/14* (2013.01); *B32B 15/20* (2013.01); *B32B 17/04* (2013.01); *B32B 27/34* (2013.01); *C08G 73/00* (2013.01); *C08J 5/043* (2013.01); *C08L 35/00* (2013.01); *C08L 79/04* (2013.01); *H01L 23/00* (2013.01); *H01L 23/145* (2013.01); *H01L 23/562* (2013.01); *H05K 1/0326* (2013.01); *B32B 2250/03* (2013.01); *B32B 2250/04* (2013.01); *B32B 2255/26* (2013.01); *B32B 2260/046* (2013.01); *B32B 2262/101* (2013.01); *B32B 2311/12* (2013.01); *B32B 2311/24* (2013.01); *B32B 2457/08* (2013.01); *C08J 2379/04* (2013.01); *C08K 3/36* (2013.01); *C08K 2003/282* (2013.01); *C08K 2003/385* (2013.01); *H01L 21/4846* (2013.01); *H05K 1/0346* (2013.01); *H05K 1/0366* (2013.01); *H05K 1/0373* (2013.01)

(58) Field of Classification Search
CPC ..... C08J 5/24; C08J 2379/04; H01L 21/4846; H01L 23/145; H01L 23/562; B32B 5/02; B32B 15/14; B32B 15/20; B32B 2250/03; B32B 2250/04; B32B 2255/26; B32B 2260/046; B32B 2262/101; B32B 2311/12; B32B 2311/24; B32B 2457/08; C08L 79/04
USPC ........................................ 428/458
See application file for complete search history.

(56) References Cited

U.S. PATENT DOCUMENTS

| | | | |
|---|---|---|---|
| 2009/0017316 A1 | 1/2009 | Kato et al. | |
| 2015/0267047 A1* | 9/2015 | Takahashi | C08G 59/621 428/418 |
| 2016/0125971 A1 | 5/2016 | Hasebe et al. | |

FOREIGN PATENT DOCUMENTS

| JP | H06-100633 A | 4/1994 |
|---|---|---|
| JP | 07165825 A * | 6/1995 |

(Continued)

OTHER PUBLICATIONS

International Search Report from Patent Application No. PCT/JP2016/069748, dated Sep. 20, 2016.
(Continued)

*Primary Examiner* — Hui H Chin
(74) *Attorney, Agent, or Firm* — Greenblum & Bernstein, P.L.C.

(57) ABSTRACT

A resin composition containing a compound represented by the following general formula (a) or the following general formula (b), an alkenyl-substituted nadimide compound, and a maleimide compound:

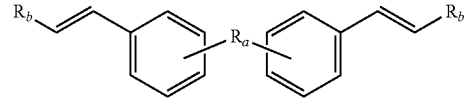

wherein $R_a$ represents a group represented by the following general formula (c),

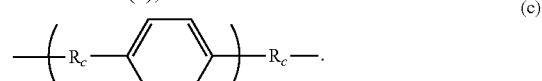

9 Claims, No Drawings

(51) Int. Cl.

| | | |
|---|---|---|
| *B32B 15/08* | (2006.01) | |
| *H05K 1/03* | (2006.01) | |
| *B32B 17/04* | (2006.01) | |
| *B32B 5/00* | (2006.01) | |
| *C08L 35/00* | (2006.01) | |
| *B32B 27/34* | (2006.01) | |
| *B32B 5/02* | (2006.01) | |
| *B32B 15/14* | (2006.01) | |
| *B32B 15/20* | (2006.01) | |
| *H01L 23/14* | (2006.01) | |
| *C08K 3/36* | (2006.01) | |
| *C08K 3/38* | (2006.01) | |
| *C08K 3/28* | (2006.01) | |
| *H01L 21/48* | (2006.01) | |

(56) References Cited

FOREIGN PATENT DOCUMENTS

| | | |
|---|---|---|
| JP | H07-165825 A | 6/1995 |
| JP | 2009-035728 A | 2/2009 |
| JP | 2009-191218 A | 8/2009 |
| JP | 2009191218 A * | 8/2009 |
| JP | 2011-088981 A | 5/2011 |
| JP | 2011-102345 A | 5/2011 |
| JP | 2012-197336 A | 10/2012 |
| JP | 2012197336 A * | 10/2012 |
| JP | 2013-001807 A | 1/2013 |
| JP | 2013-127022 A | 6/2013 |
| JP | 2013-216884 A | 10/2013 |
| TW | 201504039 A | 2/2015 |
| WO | 2014/061812 A1 | 4/2014 |

OTHER PUBLICATIONS

International Preliminary Report on Patentability from Patent Application No. PCT/JP2016/069748, dated Jan. 9, 2018.

* cited by examiner

RESIN COMPOSITION AND PREPREG, RESIN SHEET, LAMINATE, AND PRINTED CIRCUIT BOARD

TECHNICAL FIELD

The present invention relates to a resin composition and a prepreg, a resin sheet, a laminate, and a printed circuit board comprising the same.

BACKGROUND ART

Semiconductor packages widely used in electronics (e.g., personal computers), communication devices, etc. have been more highly functionalized or miniaturized in recent years. Along with this, the high integration or high-density packaging of each component for semiconductor packages has been increasingly accelerated. In the high integration or the high-density packaging, the difference in the coefficient of thermal expansion between a semiconductor device and a printed circuit board for semiconductor plastic packages causes the undesired warpage of semiconductor plastic packages. Various measures against this problem have been attempted.

One example of the measures includes reduction in thermal expansion of insulating layers for use in printed circuit boards. This approach is to bring the coefficient of thermal expansion of a printed circuit board close to the coefficient of thermal expansion of a semiconductor device to thereby suppress the warpage (see, for example, Patent Literatures 1 and 2).

In addition to the reduction in thermal expansion of printed circuit boards, increase in the rigidity of laminates (high rigidity) or increase in the glass transition temperatures of laminates (high Tg) has been studied as an approach for suppressing the warpage of semiconductor plastic packages (see, for example, Patent Literature 3).

CITATION LIST

Patent Literature

Patent Literature 1: Japanese Patent Laid-Open No. 2013-216884
Patent Literature 2: Japanese Patent Laid-Open No. 2009-035728
Patent Literature 3: Japanese Patent Laid-Open No. 2013-001807

SUMMARY OF INVENTION

Technical Problem

However, only the reduction in thermal expansion, the high Tg, etc. described above cannot satisfy requirements for resin compositions intended for electronic materials or the like. Thus, there is room for further improvement. For example, metal foil-clad laminates obtained by laminating a prepreg in a semi-cured state (B-stage) of a thermosetting resin composition with a metal foil such as a copper foil and applying heat and pressure to the resulting laminate are routinely used as printed circuit boards. For applying heat and pressure to the laminate, it is desired that the prepreg should have moderate flowability. However, high viscosity during melting by heating (melt viscosity) disadvantageously deteriorates flowing characteristics (resin flow properties) in laminate preparation.

When the prepreg is laminated with the metal foil such as a copper foil, the laminate is exposed to a chemical solution in an etching step, a desmear step, a plating step, and the like. Therefore, if the laminate has low chemical resistance, the quality or productivity of products is disadvantageously deteriorated. Particularly, in the desmear step, a strongly alkaline washing solution is used for the purpose of removing smears caused by mechanical drill or laser drill. Therefore, if the laminate has insufficient chemical resistance, the inner walls of through-holes or the surface of other resin layers is eluted in addition to smears, and as a result, the undesired contamination of the laminate becomes pronounced (desmear resistance).

As mentioned above, the preparation of printed circuit boards requires low melt viscosity, excellent moldability attributed to high resin flow properties, and excellent desmear resistance. However, it is difficult to achieve these properties at a high level, and there is still room for improvement.

The present invention has been made in light of these circumstances, and an object of the present invention is to provide a resin composition having low melt viscosity, excellent moldability attributed to high resin flow properties, and excellent desmear resistance.

Solution to Problem

The present inventors have conducted diligent studies and consequently found that the object can be attained by use of a resin composition comprising a compound having a particular structure, an alkenyl-substituted nadimide, and a maleimide compound. On the basis of the finding, the present invention has been completed.

<1>

A resin composition comprising
a compound represented by the following general formula (a) or the following general formula (b),
an alkenyl-substituted nadimide compound, and
a maleimide compound:

R—CH=CH—R'     (a)

wherein R represents a phenyl group which may have one or more of an alkyl group having 1 to 6 carbon atoms, an alkoxy group, a phenoxy group, a hydroxyl group or an amino group, a naphthyl group which may have one or more of an alkyl group having 1 to 6 carbon atoms, an alkoxy group, a phenoxy group, a hydroxyl group or an amino group, or a biphenyl group which may have one or more of an alkyl group having 1 to 6 carbon atoms, an alkoxy group, a phenoxy group, a hydroxyl group or an amino group, and R' represents a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms, and

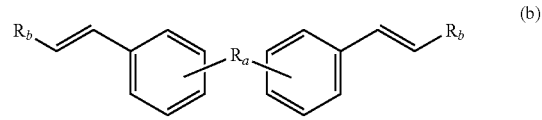

wherein $R_a$ represents a group represented by the following general formula (c), and a plurality of $R_b$ moieties each independently represent a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms:

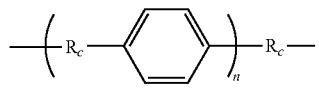

(c)

wherein each $R_c$ independently represents a methylene group, an isopropylidene group, or a substituent represented by —CO—, —O—, —S— or >$SO_2$, and n represents an integer of 0 to 5.

<2>

The resin composition according to <1>, wherein the compound represented by the general formula (a) or the general formula (b) comprises at least one compound selected from the group consisting of 1-propenylbenzene, 1-methoxy-4-(1-propenyl)benzene, 1,2-diphenylethene, 4-propenyl-phenol, and a compound represented by the following formula (b1):

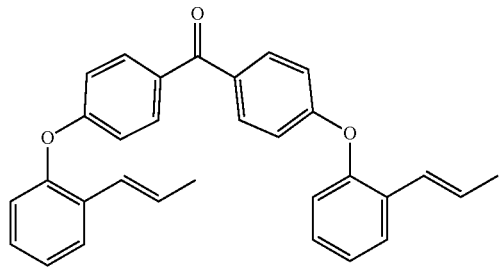

(b1)

<3>

The resin composition according to <1> or <2>, wherein the resin composition comprises, as the alkenyl-substituted nadimide compound, a compound represented by the following general formula (1):

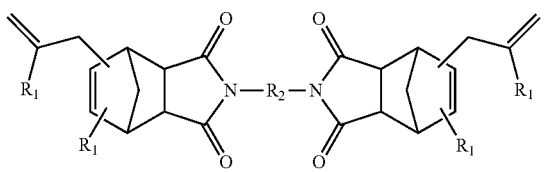

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following general formula (2) or (3):

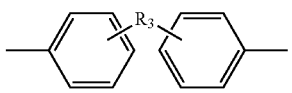

(2)

wherein $R_3$ represents a methylene group, an isopropylidene group, or a substituent represented by —CO—, —O—, —S—, or >$SO_2$, and

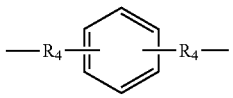

(3)

wherein each $R_4$ independently represents an alkylene group having 1 to 4 carbon atoms, or a group represented by >$SO_2$.

<4>

The resin composition according to any of <1> to <3>, wherein the resin composition comprises, as the alkenyl-substituted nadimide compound, a compound represented by the following formula (4) and/or (5):

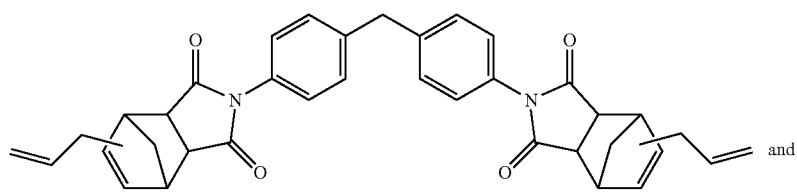

(4)

and

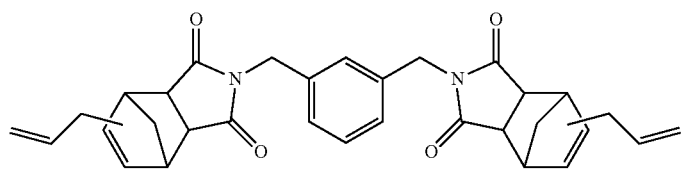

(5)

<5>

The resin composition according to any of <1> to <4>, wherein the resin composition comprises, as the maleimide compound, at least one compound selected from the group consisting of bis(4-maleimidophenyl)methane, 2,2-bis{4-(4-maleimidophenoxy)-phenyl}propane, bis(3-ethyl-5- methyl-4-maleimidophenyl)methane, polytetramethylene oxide-bis(4-maleimidobenzoate), and a maleimide compound represented by the following general formula (6):

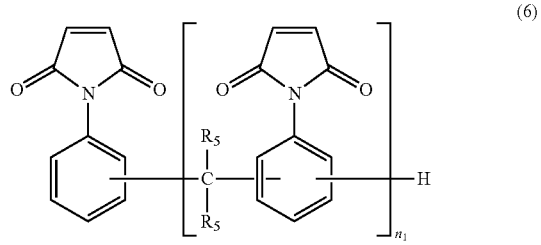

(6)

wherein each $R_5$ independently represents a hydrogen atom or a methyl group, and $n_1$ represents an integer of 1 or more.

<6>

The resin composition according to any of <1> to <5>, further comprising a cyanic acid ester compound.

<7>

The resin composition according to <6>, wherein the resin composition comprises, as the cyanic acid ester compound, a compound represented by the following general formula (7) and/or (8):

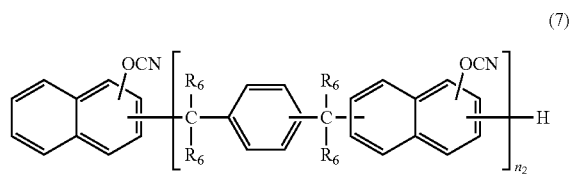

(7)

wherein each $R_6$ independently represents a hydrogen atom or a methyl group, and $n_2$ represents an integer of 1 or more, and

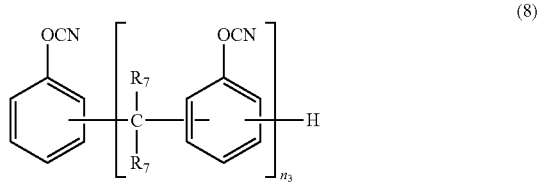

(8)

wherein each $R_7$ independently represents a hydrogen atom or a methyl group, and $n_3$ represents an integer of 1 or more.

<8>

The resin composition according to any of <1> to <7>, further comprising an inorganic filler.

<9>

The resin composition according to <8>, wherein the resin composition comprises, as the inorganic filler, at least one selected from the group consisting of silica, alumina, aluminum nitride, and boron nitride.

<10>

A prepreg comprising a base material and the resin composition according to any of <1> to <9>, the base material being impregnated or coated with the resin composition.

<11>

The prepreg according to <10>, wherein the base material is at least one selected from the group consisting of E glass cloth, T glass cloth, S glass cloth, Q glass cloth, and an organic fiber.

<12>

A resin sheet comprising a support and the resin composition according to any of <1> to <9>, the support being coated with the resin composition.

<13>

A laminate comprising one or more layers of at least one selected from the group consisting of the prepreg according to <10> or <11> and the resin sheet according to <12>, wherein the laminate comprises a cured product of the resin composition contained in the at least one selected from the group consisting of the prepreg and the resin sheet.

<14>

A metal foil-clad laminate comprising at least one selected from the group consisting of the prepreg according to <10> or <11> and the resin sheet according to <12>, and a metal foil disposed on one side or both sides of the at least one selected from the group consisting of the prepreg and the resin sheet, wherein the metal foil-clad laminate comprises a cured product of the resin composition contained in the at least one selected from the group consisting of the prepreg and the resin sheet.

<15>

A printed circuit board comprising an insulating layer and a conductor layer formed on the surface of the insulating layer, wherein the insulating layer comprises the resin composition according to any of <1> to <9>.

Advantageous Effects of Invention

The present invention can provide a resin composition having low melt viscosity, excellent moldability attributed to high resin flow properties, and excellent desmear resistance.

DESCRIPTION OF EMBODIMENTS

Hereinafter, the mode for carrying out the present invention (hereinafter, also referred to as the "present embodiment") will be described in detail. The present embodiment below is given for illustrating the present invention and is not intended to limit the present invention to the contents described below. Various changes or modifications may be made in the present invention without departing from the spirit of the present invention.

The resin composition of the present embodiment is a resin composition comprising a compound represented by the following general formula (a) or the following general formula (b) (hereinafter, also referred to as "compound A"), an alkenyl-substituted nadimide compound, and a maleimide compound:

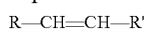

R—CH=CH—R'  (a)

wherein R represents a phenyl group which may have one or more of an alkyl group having 1 to 6 carbon atoms, an alkoxy group, a phenoxy group, a hydroxyl group or an amino group, a naphthyl group which may have one or more of an alkyl group having 1 to 6 carbon atoms, an alkoxy group, a phenoxy group, a hydroxyl group or an amino group, or a biphenyl group which may have one or more of an alkyl group having 1 to 6 carbon atoms, an alkoxy group, a phenoxy group, a hydroxyl group or an amino group, and R' represents a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms, and

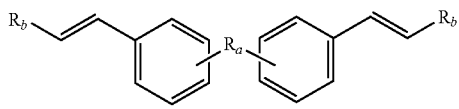

(b)

wherein $R_a$ represents a group represented by the following general formula (c), and a plurality of $R_b$ moieties each independently represent a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms:

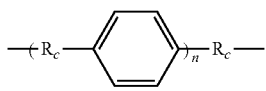

(c)

wherein each $R_c$ independently represents a methylene group, an isopropylidene group, or a substituent represented by —CO—, —O—, —S— or >SO$_2$, and n represents an integer of 0 to 5.

The present inventors have studied the reason why the viscosity of the resin composition comprising the alkenyl-substituted nadimide compound and the maleimide compound increases to result in lowering the resin flow properties, and consequently hypothesized that, while the alkenyl-substituted nadimide compound and the maleimide compound cause a reaction such as ene reaction (e.g., the formula (i) given below) or Diels-Alder reaction (e.g., the formula (ii) given below), these reactions proceeds too rapidly. The formula (i) and the formula (ii) are merely given for illustrative purposes, and the working effects of the present embodiment should not be restrictively interpreted on the basis of these formulas. The present inventors have surprisingly found, on the basis of the hypothesis, that combined use with the compound A, which is an α-alkenyl-phenyl compound, can suppress increase in viscosity and exerts high resin flow properties. The reason for this is uncertain, but is presumed as follows: when the compound A reacts with the maleimide compound, the reaction proceeds slowly, for example, because the ene reaction does not proceed while the phenyl moiety loses aromaticity with the progress of the Diels-Alder reaction. As a result, the reaction temperature of the resin composition used in combination with the compound A is elevated. Thus, the melt viscosity of the resin composition can be reduced so that high resin flow properties are exerted. This presumably allows the resin composition to exert excellent moldability. In addition, the Diels-Alder reaction, etc. described above facilitates forming a stable structure such as a 6-membered ring structure, and therefore, presumably, the resin composition of the present embodiment can also exert excellent desmear resistance. However, the working effects of the present embodiment are not limited by these presumptions.

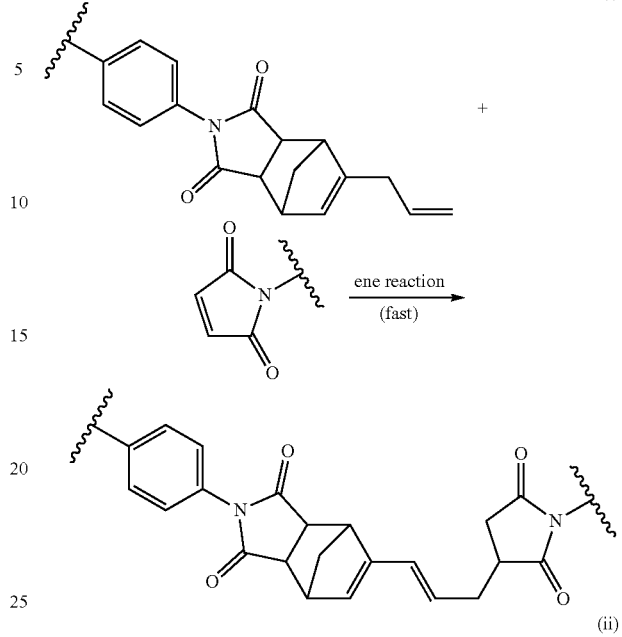

(i)

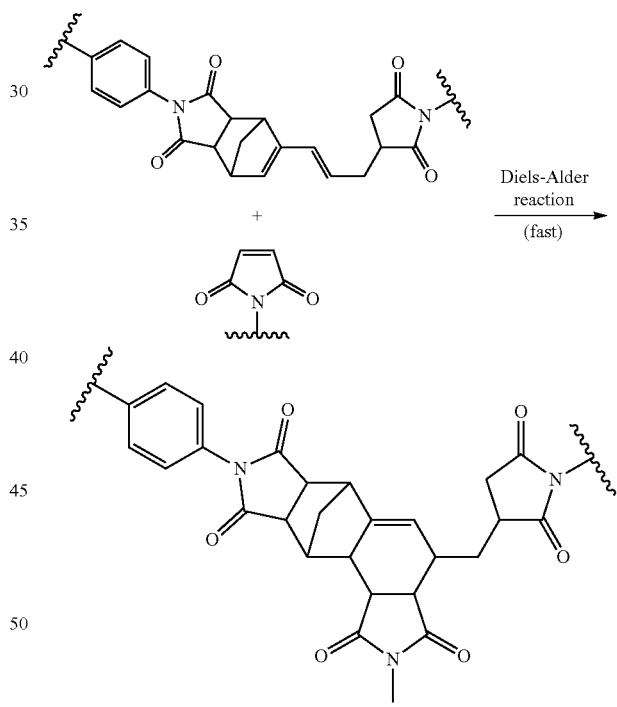

(ii)

In the general formula (a), R represents a phenyl group which may have one or more of an alkyl group having 1 to 6 carbon atoms, an alkoxy group, a phenoxy group, a hydroxyl group or an amino group, a naphthyl group which may have one or more of an alkyl group having 1 to 6 carbon atoms, an alkoxy group, a phenoxy group, a hydroxyl group or an amino group, or a biphenyl group which may have one or more of an alkyl group having 1 to 6 carbon atoms, an alkoxy group, a phenoxy group, a hydroxyl group or an amino group, and is preferably the phenyl group in view of moldability and desmear resistance. R' is a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms. R' is preferably a methyl group or the phenyl group in view of moldability.

In the general formula (b), $R_a$ is a group represented by the general formula (c), and a plurality of $R_b$ are each independently a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms. In the general formula (c), each $R_c$ independently represents a methylene group, an isopropylidene group, or a substituent represented by —CO—, —O—, —S— or >SO$_2$, and n represents an integer of 0 to 5. n is preferably an integer of 0 to 3.

The compound A is not particularly limited as long as the compound A has a structure represented by the general formula (a) or the general formula (b). Specific examples thereof include 1-propenylbenzene, 1-methoxy-4-(1-propenyl)benzene, 1,2-diphenylethene (stilbene), 4-propenyl-phenol, and a compound represented by the formula (b1) given below. Among them, 1,2-diphenylethene or a compound represented by the formula (b1) given below is preferred, and a compound represented by the formula (b1) given below is more preferred, in view of moldability and desmear resistance. These compounds A may be used singly or may be used in combinations of two or more thereof.

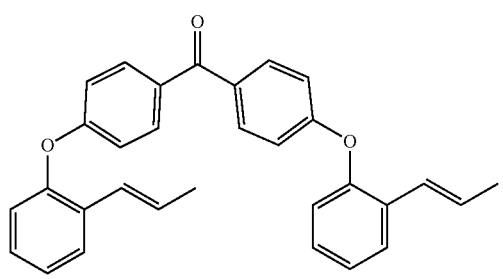

(b1)

In the resin composition of the present embodiment, the content of the compound A can be suitably determined and is preferably 5 to 30 parts by mass, more preferably 10 to 20 parts by mass, based on 100 parts by mass in total of resin-constituting components in the resin composition. When the content of the compound A falls within the range described above, resin flow properties, desmear resistance, etc. can be further improved.

The alkenyl-substituted nadimide compound is not particularly limited as long as the alkenyl-substituted nadimide compound is an allyl compound having two or more nadimide groups in the molecule. The alkenyl-substituted nadimide compound is preferably a compound represented by the following general formula (1) in view of increasing elastic modulus under heat (e.g., flexural modulus at a solder reflow temperature):

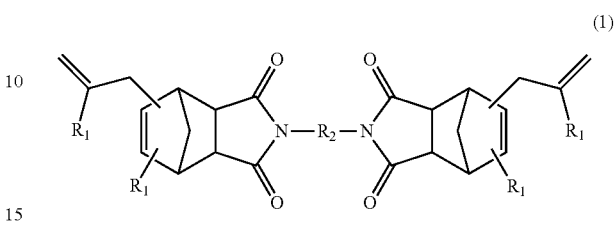

(1)

In the general formula (1), each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following general formula (2) or (3):

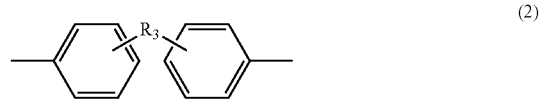

(2)

In the general formula (2), $R_3$ represents a methylene group, an isopropylidene group, or a substituent represented by —CO—, —O—, —S—, or >SO$_2$.

(3)

In the general formula (3), each $R_4$ independently represents an alkylene group having 1 to 4 carbon atoms, or a group represented by >SO$_2$.

Among those described above, a compound represented by the formula (4) and/or (5) given below is more preferred as the alkenyl-substituted nadimide compound. Commercially available products can also be used as these compounds. Examples of the compound represented by the formula (4) include "BANI-M" manufactured by Maruzen Petrochemical Co., Ltd. Examples of the compound represented by the formula (5) include "BANI-X" manufactured by Maruzen Petrochemical Co., Ltd. These compounds may be used singly or may be used in combinations of two or more thereof.

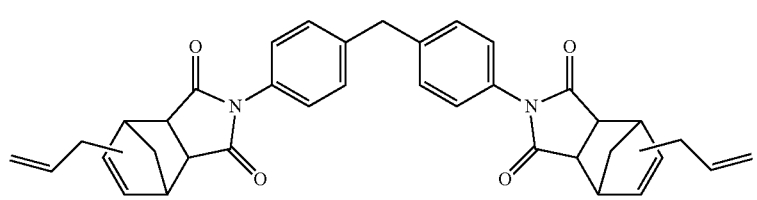

(4)

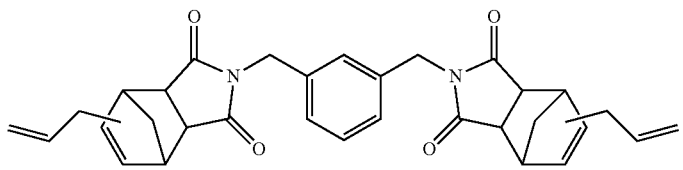

(5)

In the resin composition of the present embodiment, the content of the alkenyl-substituted nadimide compound can be suitably determined in consideration of the ratio of the number of functional group between alkenyl groups as a functional group in the alkenyl-substituted nadimide compound and maleimide groups in the maleimide compound, and is preferably 10 to 60 parts by mass, more preferably 15 to 50 parts by mass, further preferably 20 to 40 parts by mass, based on 100 parts by mass in total of resin-constituting components in the resin composition. When the content of the alkenyl-substituted nadimide compound falls within the range described above, the resulting resin composition can maintain excellent moldability even with an inorganic filler, while curability, elastic modulus under heat, desmear resistance, etc. can be further improved.

The maleimide compound is not particularly limited as long as the compound has one or more maleimide groups in the molecule. Preferred examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, polytetramethylene oxide-bis(4-maleimidobenzoate), a maleimide compound represented by the formula (6) given below, prepolymers of these maleimide compounds, and prepolymers of the maleimide compounds and amine compounds. These compounds may be used singly or may be used in combinations of two or more thereof.

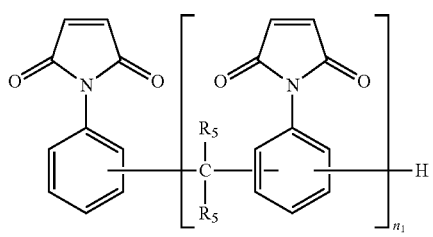

(6)

In the general formula (6), each $R_5$ independently represents a hydrogen atom or a methyl group, and $n_1$ represents an integer of 1 or more.

In the formula (6), $R_5$ is preferably a hydrogen atom. $n_1$ is preferably 10 or less, more preferably 7 or less. The maleimide compound represented by the formula (6) may be used singly or may be used in combinations of two or more thereof. In the present embodiment, the combination of two or more maleimide compounds represented by the formula (6) is preferred. Such a mixture of the maleimide compounds more preferably comprises a maleimide compound wherein $n_1$ is 2 or more and further preferably comprises a maleimide compound wherein $n_1$ is 3 or more, in view of providing a more favorable rate of elastic modulus loss.

Among them, the maleimide compound is more preferably at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, polytetramethylene oxide-bis(4-maleimidobenzoate), and a maleimide compound represented by the formula (6), in view of increasing elastic modulus under heat.

In the resin composition of the present embodiment, the content of the maleimide compound can be suitably determined in consideration of the ratio of the number of functional group between the number of alkenyl groups (a) as a functional group in the alkenyl-substituted nadimide compound and the number of maleimide groups (1) in the maleimide compound ($[\beta/\alpha]$), and is preferably 10 to 70 parts by mass, more preferably 15 to 60 parts by mass, further preferably 20 to 50 parts by mass, based on 100 parts by mass in total of resin-constituting components in the resin composition. When the content of the maleimide compound falls within the range described above, the resulting resin composition can maintain excellent moldability even with an inorganic filler, while curability, elastic modulus under heat, desmear resistance, etc. can be further improved.

In the resin composition of the present embodiment, the ratio of the number of maleimide groups ($\beta$) in the maleimide compound to the number of alkenyl groups (a) in the alkenyl-substituted nadimide compound [P/a] is preferably 0.9 to 4.3, more preferably 1.5 to 4.0. When this functional group ratio ([P/a]) falls within the range described above, low thermal expansion, elastic modulus under heat, heat resistance, heat resistance upon moisture-absorbing, desmear resistance, easy curability, etc. can be further improved.

Preferably, the resin composition of the present embodiment further comprises a cyanic acid ester compound in view of desmear resistance and high elastic modulus under heat. Examples of the type of the cyanic acid ester compound include, but are not particularly limited to, a naphthol aralkyl-based cyanic acid ester represented by the general formula (7) given below, a novolac-based cyanic acid ester represented by the general formula (8) given below, biphenyl aralkyl-based cyanic acid esters, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl) thioether, bis(4-cyanatophenyl)sulfone, and 2,2-bis(4-cyanatophenyl)propane.

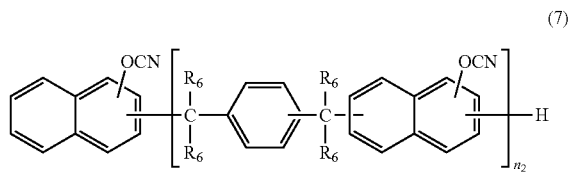

(7)

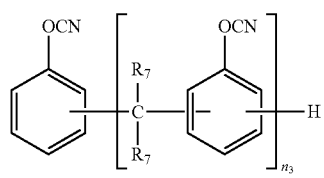

(8)

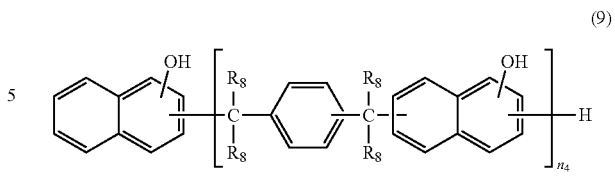

(9)

In the general formula (7), each $R_6$ independently represents a hydrogen atom or a methyl group, and $n_2$ represents an integer of 1 or more.

In the formula, $R_6$ is preferably a hydrogen atom. The upper limit of $n_2$ is preferably 10 or less, more preferably 6 or less.

In the general formula (8), each $R_7$ independently represents a hydrogen atom or a methyl group, and $n_3$ represents an integer of 1 or more.

In the formula (8), $R_7$ is preferably a hydrogen atom. The upper limit of $n_3$ is preferably 10 or less, more preferably 7 or less.

Among those described above, a naphthol aralkyl-based cyanic acid ester represented by the general formula (7), a novolac-based cyanic acid ester represented by the general formula (8), or a biphenyl aralkyl-based cyanic acid ester is more preferred because of excellent flame retardancy, high curability, and the low coefficient of thermal expansion of a cured product. A naphthol aralkyl-based cyanic acid ester represented by the general formula (7) or a novolac-based cyanic acid ester represented by the general formula (8) is further preferred.

In the resin composition of the present embodiment, the content of the cyanic acid ester compound is preferably 0.1 to 20 parts by mass, more preferably 1 to 10 parts by mass, further preferably 1 to 5 parts by mass, based on 100 parts by mass in total of resin-constituting components in the resin composition. When the content of the cyanic acid ester compound falls within the range described above, the resulting resin composition can maintain excellent moldability even with an inorganic filler, while curability, elastic modulus under heat, desmear resistance, etc. can be further improved.

Methods for producing these cyanic acid ester compounds are not particularly limited, and the cyanic acid ester compound used in the present embodiment may be produced by any method existing as a cyanic acid ester synthesis method. As a specific example, the cyanic acid ester compound can be obtained by reacting a naphthol aralkyl-based phenol resin represented by the general formula (9) given below with cyanogen halide in the presence of a basic compound in an inert organic solvent. An alternate method that may be adopted involves forming a salt of a similar naphthol aralkyl-based phenol resin and a basic compound in a solution containing water, followed by two-phase interfacial reaction with cyanogen halide for synthesis.

In the general formula (9), each $R_8$ independently represents a hydrogen atom or a methyl group and is particularly preferably a hydrogen atom.

In the formula (9), $n_4$ represents an integer of 1 or more. The upper limit of $n_4$ is preferably 10, more preferably 6.

The naphthol aralkyl-based cyanic acid ester compound can be selected from those obtained by condensing cyanic acid with a naphthol aralkyl resin obtained through the reaction of a naphthol such as α-naphthol or f-naphthol with p-xylylene glycol, α,α'-dimethoxy-p-xylene, 1,4-di(2-hydroxy-2-propyl)benzene, or the like.

Preferably, the resin composition of the present embodiment further comprises an inorganic filler. The inorganic filler is not particularly limited as long as the inorganic filler has insulating properties. Examples thereof include silicas (e.g., natural silica, fused silica, amorphous silica, and hollow silica), alumina, aluminum nitride, boron nitride, boehmite, molybdenum oxide, titanium oxide, silicone rubber, hybrid silicone powder, zinc borate, zinc stannate, clay, kaolin, talc, fired clay, fired kaolin, fired talc, mica, short glass fiber (fine glass powders such as E glass and D glass), hollow glass, and spherical glass. These inorganic fillers may be used singly or may be used in combinations of two or more thereof.

Among them, at least one material selected from the group consisting of silica, alumina, aluminum nitride, and boron nitride is preferred. Particularly, silica is preferred in view of low thermal expansion, and alumina, aluminum nitride, or boron nitride is preferred in view of high thermal conductivity.

In the resin composition of the present embodiment, the content of the inorganic filler is not particularly limited and is preferably 50 to 500 parts by mass based on 100 parts by mass in total of resin-constituting components in the resin composition in view of characteristics such as low thermal expansion and high thermal conductivity. The content of the inorganic filler is more preferably 100 to 300 parts by mass, further preferably 100 to 250 parts by mass.

In the resin composition of the present embodiment, a component other than the inorganic filler, such as a silane coupling agent or a wetting dispersant, may also be used in order to improve the dispersibility of fine particles and the adhesion strength between the resin and the fine particles or glass cloth.

The silane coupling agent is not particularly limited as long as the silane coupling agent is generally used in the surface treatment of inorganic matter. Specific examples thereof include: aminosilane-based silane coupling agents such as γ-aminopropyltriethoxysilane and N-β-(aminoethyl)-γ-aminopropyltrimethoxysilane; epoxysilane-based silane coupling agents such as γ-glycidoxypropyltrimethoxysilane; acrylsilane-based silane coupling agents such as γ-acryloxypropyltrimethoxysilane; cationic silane-based silane coupling agents such as N-β-(N-vinylbenzylaminoethyl)-γ-aminopropyltrimethoxysilane hydrochloride; phenylsilane-based silane coupling agents; and styrylsilane-based coupling agents such as p-styryltrimethoxysilane, p-styryltriethoxysilane, p-styrylmethyldimethoxysilane, p-styrylmethyldiethoxysilane, and N-(vinylbenzyl)-2-aminoethyl-3-aminopropyltrimethoxysilane hydrochloride. These silane coupling agents may be used singly or may be used in combinations of two or more thereof.

The wetting dispersant is not particularly limited as long as the wetting dispersant is used as a dispersion stabilizer for paint. Examples of the wetting dispersant include "DISPERBYK-110", "DISPERBYK-111", "DISPERBYK-118", "DISPERBYK-180", "DISPERBYK-161", "BYK-W996", "BYK-W9010", and "BYK-W903" manufactured by BYK Japan K.K. These wetting dispersants may be used singly or may be used in combinations of two or more thereof.

The resin composition of the present embodiment may be supplemented with an additional resin, in addition to the components described above, without impairing the intended characteristics of the present embodiment. The type of the additional resin is not particularly limited as long as the resin does not impair insulating properties. Examples thereof include epoxy resins, benzoxazine compounds, phenol resins, and thermoplastic resins. Appropriately combined use with these resins can further improve metal adhesion, stress-relaxing properties, etc.

For the combined use with, for example, an epoxy resin, the epoxy resin is not particularly limited as long as the compound has two or more epoxy groups in one molecule. Examples thereof include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, cresol novolac-based epoxy resins, biphenyl-based epoxy resins, naphthalene-based epoxy resins, dihydroanthracene-based epoxy resins, naphthylene ether-based epoxy resins, trifunctional phenol-based epoxy resins, tetrafunctional phenol-based epoxy resins, glycidyl ester-based epoxy resins, phenol aralkyl-based epoxy resins, biphenyl aralkyl-based epoxy resins, aralkyl novolac-based epoxy resins, naphthol aralkyl-based epoxy resins, dicyclopentadiene-based epoxy resins, polyol-based epoxy resins, isocyanurate ring-containing epoxy resins, and halides thereof. Among them, a naphthylene ether-based epoxy resin or a biphenyl aralkyl-based epoxy resin is more preferred in view of heat resistance and low thermal expansion. These epoxy resins may be used singly or may be used in combinations of two or more thereof.

The content of the epoxy resin is not particularly limited and is preferably 5 to 50% by mass, more preferably 7 to 35% by mass, based on 100 parts by mass in total of resin-constituting components in the resin composition. When the content of the epoxy resin falls within the range described above, heat resistance and curability tend to be further improved.

In the resin composition of the present embodiment, a curing accelerator may also be used as long as it does not impair intended characteristics. Specific examples of the curing accelerator include, but are not limited to: imidazole compounds; organic peroxides such as benzoyl peroxide, lauroyl peroxide, acetyl peroxide, p-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; and dioctyl tin oxide and other organic tin compounds such as alkyl tin and alkyl tin oxide. These curing accelerators may be used singly or may be used in combinations of two or more thereof.

The resin composition of the present embodiment preferably comprises an imidazole compound as the curing accelerator. The imidazole compound is not particularly limited and is preferably an imidazole compound represented by the following formula (10) from the viewpoint of more effectively and reliably exerting the working effects of the present embodiment.

(10)

In this general formula (10), Ar represents a phenyl group, a naphthalene group, a biphenyl group, or an anthracene group, or a monovalent group thereof modified with a hydroxy group and is particularly preferably a phenyl group. $R_9$ represents a hydrogen atom, an alkyl group or a monovalent group thereof modified with a hydroxy group, or an aryl group. Examples of the aryl group include, but are not limited to, a substituted or unsubstituted phenyl group, naphthalene group, biphenyl group, and anthracene group. A phenyl group is preferred. More preferably, both of the Ar group and the $R_9$ group are phenyl groups.

Examples of the imidazole compound include, but are not limited to, 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,4,5-triphenylimidazole, and 2-phenyl-4-methylimidazole. Among them, 2,4,5-triphenylimidazole or 2-phenyl-4-methylimidazole is more preferred, and 2,4,5-triphenylimidazole is particularly preferred.

In the resin composition of the present embodiment, the content of the imidazole compound is not particularly limited and is preferably 0.01 to 10 parts by mass, more preferably 0.1 to 5 parts by mass, based on 100 parts by mass in total of resin-constituting components in the resin composition. When the content of the imidazole compound falls within such a range, a resin composition, a prepreg, and a resin sheet excellent in curability and moldability, and a metal foil-clad laminate and a printed circuit board from these raw materials can be obtained.

The resin composition of the present embodiment may contain a solvent, if necessary. For example, use of an organic solvent reduces viscosity during the preparation of the resin composition and thus improves handleability while enhancing the impregnation of glass cloth with the resin composition. The type of the solvent is not particularly limited as long as the solvent is capable of dissolving a portion or the whole of the resins in the resin composition. Specific examples thereof include, but are not limited to: ketones such as acetone, methyl ethyl ketone, and methylcellosolve; aromatic hydrocarbons such as toluene and xylene; amides such as dimethylformamide; and propylene glycol monomethyl ether and its acetate. These solvents may be used singly or may be used in combinations of two or more thereof.

The resin composition of the present embodiment can be prepared according to a routine method. For example, a preferred method involves obtaining a resin composition homogeneously containing the compound A represented by the general formula (a) or the general formula (b), the alkenyl-substituted nadimide compound, the maleimide compound, and other optional components mentioned above. Specifically, for example, these components can be sequentially added to the solvent and fully stirred to readily prepare the resin composition of the present embodiment.

An organic solvent can be used, if necessary, in the preparation of the resin composition of the present embodiment. The type of the organic solvent is not particularly limited as long as the solvent is capable of dissolving the resins in the resin composition. Specific examples thereof are as listed above.

Treatment (stirring, mixing, or kneading treatment, etc.) known in the art for uniformly dissolving or dispersing each component can be carried out in the preparation of the resin composition. For example, the inorganic filler can be uniformly dispersed by stirring and dispersion treatment using a stirring vessel equipped with a stirrer having an appropriate stirring ability. This enhances the dispersibility of the inorganic filler in the resin composition. The stirring, mixing, or kneading treatment can be appropriately carried out using an apparatus known in the art such as an apparatus aimed at mixing, for example, a ball mill or a bead mill, or a revolution- or rotation-type mixing apparatus.

The prepreg of the present embodiment is a prepreg comprising a base material and the resin composition of the present embodiment, the base material being impregnated or coated with the resin composition. The prepreg of the present embodiment can be obtained, for example, by combining the resin composition with the base material, specifically, impregnating or coating the base material with the resin composition. The method for producing the prepreg of the present embodiment can be carried out according to a routine method without particular limitations. Examples thereof include a method which involves impregnating or coating the base material with the resin composition, followed by semi-curing (conversion to B-stage) by heating or the like for 1 to 30 minutes in a drier of 100 to 200° C. to prepare the prepreg. In the present embodiment, the amount of the resin composition (including the inorganic filler) based on the total mass of the prepreg is not particularly limited and is preferably in the range of 30 to 90% by mass.

The base material for use in the prepreg of the present embodiment is not limited and can be appropriately selected for use from various printed circuit board materials known in the art according to the intended use or performance. Specific examples thereof include, but are not particularly limited to: glass fibers such as E glass, D glass, S glass, Q glass, spherical glass, NE glass, and T glass; non-glass inorganic fibers such as quartz; wholly aromatic polyamides such as poly-p-phenyleneterephthalamide (Kevlar®, manufactured by Du Pont K.K.) and co-poly-p-phenylene/3,4'-oxydiphenylene/terephthalamide (Technora®, manufactured by Teijin Techno Products, Ltd.); polyesters such as 2,6-hydroxynaphthoic acid/p-hydroxybenzoic acid (Vectran®, manufactured by Kuraray Co., Ltd.); and organic fibers such as poly-p-phenylene benzoxazole (Zylon®, manufactured by Toyobo Co., Ltd.) and polyimide.

Among them, E glass cloth, T glass cloth, S glass cloth, Q glass cloth, or an organic fiber is preferred from the viewpoint of low thermal expansion.

These base materials may be used singly or may be used in combinations of two or more thereof.

Examples of the form of the base material include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material can be appropriately selected for use from these materials known in the art according to the intended use or performance. Such a base material subjected to opening treatment or a glass woven fabric surface-treated with a silane coupling agent or the like is preferably used. The base material is not particularly limited by its thickness and mass. Usually, the base material of approximately 0.01 to 0.3 mm is preferably used. In particular, the base material is preferably a glass woven fabric having a thickness of 200 µm or less and a mass of 250 g/m$^2$ or less, more preferably a glass woven fabric made of, for example, E glass, S glass, or T glass fiber, from the viewpoint of strength and water absorbability.

The laminate of the present embodiment comprises one or more layers of at least one selected from the group consisting of the prepreg mentioned above and a resin sheet mentioned later and comprises a cured product of the resin composition contained in the at least one selected from the group consisting of the aforementioned prepreg and the resin sheet. This laminate can be obtained by curing one or more layers of, for example, the prepreg. The metal foil-clad laminate of the present embodiment is a metal foil-clad laminate comprising at least one selected from the group consisting of the aforementioned prepreg and resin sheet, and a metal foil disposed on one side or both sides of the at least one selected from the group consisting of the aforementioned prepreg and resin sheet, wherein the metal foil-clad laminate comprises a cured product of the resin composition contained in the at least one selected from the group consisting of the aforementioned prepreg and resin sheet. This metal foil-clad laminate can be obtained by laminating, for example, the prepreg, with a metal foil, followed by curing. Specifically, the metal foil-clad laminate of the present embodiment can be obtained by providing at least one or more layers of, for example, the prepreg, and disposing the metal foil on one side or both sides thereof, followed by lamination molding. More specifically, the metal foil-clad laminate can be produced by providing one or more layers of the aforementioned prepreg, disposing the metal (e.g., copper or aluminum) foil on one side or both sides thereof if desired, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The thickness of the metal foil is not particularly limited and is preferably 1 to 70 µm, more preferably 1.5 to 35 µm. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C. Alternatively, the prepreg may be lamination-molded in combination with a separately prepared wiring board for an inner layer to obtain a multilayer board.

The metal foil-clad laminate of the present embodiment can be preferably used as a printed circuit board by forming a predetermined wiring pattern. The metal foil-clad laminate of the present embodiment has a low coefficient of thermal expansion and favorable moldability, metal foil peel strength, and chemical resistance (particularly, desmear resistance) and can thus be used particularly effectively as a printed circuit board for semiconductor packages required to have such performance.

The resin sheet of the present embodiment comprises a support and the resin composition, the support being coated with the resin composition. Specifically, the resin composition is laminated on one side or both sides of the support. In this context, the resin sheet is used as an approach for thinning and can be produced, for example, by directly coating a support such as a metal foil or a film with a thermosetting resin (including the inorganic filler) for use in prepregs, etc., followed by drying.

The support for use in the production of the resin sheet of the present embodiment is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

The resin sheet of the present embodiment is particularly preferably a product obtained by coating the support with the aforementioned resin composition, followed by semi-curing (conversion to B-stage). The method for producing the resin sheet of the present embodiment is generally preferably a method for producing a composite of a B-stage resin and a support. Specific examples thereof include a method which involves coating the support such as a copper foil with the resin composition, followed by semi-curing by a method such as heating for 1 to 60 minutes in a drier of 100 to 200° C. to produce the resin sheet. The amount of the resin composition applied to the support is preferably in the range of 1 to 300 m in terms of the resin thickness of the resin sheet.

The resin sheet of the present embodiment can be used as a buildup material for printed circuit boards.

The laminate of the present embodiment can be obtained by curing one or more layers of, for example, the resin sheet. The metal foil-clad laminate of the present embodiment can be obtained by laminating, for example, the resin sheet, with a metal foil, followed by curing. Specifically, the metal foil-clad laminate of the present embodiment can be obtained by using, for example, the resin sheet, and disposing the metal foil on one side or both sides thereof, followed by lamination molding. More specifically, the metal foil-clad laminate can be produced by providing, for example, one layer of the resin sheet mentioned above or two or more layers of the resin sheet separated from its support as desired, disposing the metal (e.g., copper or aluminum) foil on one side or both sides thereof, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The metal foil-clad laminate is not particularly limited by its molding method and molding conditions and can be molded by use of a general approach and conditions for laminates for printed circuit boards and multilayer boards. For example, a multi-platen press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C.

The laminate of the present embodiment may be a laminate obtained by curing one or more layers of a resin sheet and one or more layers of a prepreg or may be a metal foil-clad laminate obtained by curing a metal foil laminated with a resin sheet and a prepreg.

In the case of not adopting the form of the metal foil-clad laminate in the present embodiment, an electroless plating approach may be used for forming a conductor layer that serves as a circuit and preparing a printed circuit board.

The printed circuit board of the present embodiment is a printed circuit board comprising an insulating layer and a conductor layer formed on the surface of this insulating layer, wherein this insulating layer comprises the resin composition mentioned above.

The printed circuit board of the present embodiment is prepared, for example, by forming a conductor layer that serves as a circuit by use of a metal foil or electroless plating on the insulating layer. The conductor layer is generally constituted by copper or aluminum. The insulating layer for printed circuit boards with the conductor layer formed thereon can be preferably used as a printed circuit board by forming a predetermined wiring pattern. In addition, the printed circuit board of the present embodiment can be particularly effectively used as a printed circuit board for semiconductor packages, because by virtue of the insulating layer comprising the resin composition mentioned above, the printed circuit board maintains the excellent elastic modulus even at a reflow temperature during semiconductor packaging and thereby effectively suppresses the warpage of semiconductor plastic packages, and is excellent in metal foil peel strength and desmear resistance.

Specifically, the printed circuit board of the present embodiment can be produced by, for example, the following method: first, the metal foil-clad laminate (copper-clad laminate, etc.) is prepared. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of the prepreg is laminated on the resulting inner layer circuit surface. A metal foil for an outer layer circuit is laterally laminated thereon, followed by integral molding under heat and pressure. In this way, a multilayer laminate is produced in which the insulating layer composed of the base material and a cured product of thermosetting resin composition is formed between the inner layer circuit and the metal foil for an outer layer circuit. Subsequently, this multilayer laminate is processed by hole drilling for through-holes or via holes and then subjected to desmear treatment for removing smear, which is a residue of resins derived from the resin components contained in the cured product layer. Then, the inside walls of these holes are coated with a metal plating film for the community between the inner layer circuit and the metal foil for an outer layer circuit. The metal foil for an outer layer circuit is further subjected to etching treatment for the formation of the outer layer circuit to produce the printed circuit board.

In the printed circuit board of the present embodiment, for example, the prepreg mentioned above (base material impregnated with the resin composition mentioned above), the resin sheet mentioned above, or the resin composition layer of the metal foil-clad laminate (layer composed of the resin composition mentioned above) constitutes the insulating layer comprising the resin composition mentioned above.

In the printed circuit board of the present embodiment, the insulating layer preferably has a difference of 20% or less, more preferably 0 to 20%, further preferably 0 to 15%, between the flexural modulus at 25° C. and the flexural modulus under heat at 250° C. When the difference between the flexural modulus at 25° C. and the flexural modulus under heat at 250° C. falls within the range described above, the insulating layer has a favorable rate of elastic modulus maintenance. In this context, the rate of elastic modulus maintenance refers to the ratio of the flexural modulus at 250° C. to the flexural modulus at 25° C.

In the present embodiment, examples of the approach for setting the difference between the flexural modulus at 25° C. and the flexural modulus under heat at 250° C. of the insulating layer to within 20% include, but are not particularly limited to, appropriately adjusting the type and content of each component in the resin composition for use in the insulating layer to the ranges described above.

EXAMPLES

Hereinafter, the present invention will be further specifically described with reference to Examples and Comparative Examples. However, the present invention is not intended to be limited by these Examples by any means.

Synthesis Example 1

A reactor equipped with a thermometer, a stirrer, a dropping funnel, and a reflux condenser was cooled to 0 to 5° C. in advance using brine and charged with 7.47 g (0.122 mol) of cyanogen chloride, 9.75 g (0.0935 mol) of 35% hydrochloric acid, 76 mL of water, and 44 mL of methylene chloride.

While the temperature and pH of this reactor were kept at −5 to +5° C. and 1 or lower, respectively, a solution containing 20 g (0.0935 mol) of an α-naphthol aralkyl-based phenol resin of the aforementioned formula (9) wherein all of the $R_8$ moieties were hydrogen atoms (SN485, OH group equivalent: 214 g/eq., softening point: 86° C., manufactured by Nippon Steel & Sumikin Chemical Co., Ltd.), and 14.16 g (0.14 mol) of triethylamine dissolved in 92 mL of methylene chloride was added dropwise over 1 hour through the dropping funnel with stirring. After the completion of the dropwise addition, 4.72 g (0.047 mol) of triethylamine was further added dropwise thereto over 15 minutes.

After the completion of the dropwise addition, the mixture was stirred at the same temperature as above for 15 minutes. The obtained organic layer was washed with 100 mL of water twice. Then, methylene chloride was distilled off under reduced pressure with an evaporator, and the residue was finally concentrated to dryness at 80° C. for 1 hour to obtain 23.5 g of a cyanic acid esterified product of the α-naphthol aralkyl-based phenol resin (α-naphthol aralkyl-based cyanic acid ester resin of the general formula (7) wherein all of the $R_6$ moieties were hydrogen atoms).

Example 1

5 parts by mass of the α-naphthol aralkyl-based cyanic acid ester resin obtained in Synthesis Example 1, 45.5 parts by mass of a novolac-based maleimide compound (manufactured by Daiwakasei Industry Co., Ltd., "BMI-2300", maleimide functional equivalent: 186 g/eq.), 24.5 parts by mass of bisallylnadimide (manufactured by Maruzen Petrochemical Co., Ltd., "BANI-M", alkenyl functional equivalent: 286 g/eq.), 15 parts by mass of 4,4-bis(o-propenylphenoxy)benzophenone (manufactured by Evonik Industries AG, "Compimide TM-123"), 10 parts by mass of a biphenyl aralkyl-based epoxy resin (manufactured by Nippon Kayaku Co., Ltd., "NC-3000H"), 80 parts by mass of silica 1 (manufactured by Denka Co., Ltd., "FB-3SDC"), 120 parts by mass of silica 2 (manufactured by Admatechs Co., Ltd., "SC-5500SQ", 2.5 parts by mass of an epoxysilane-based silane coupling agent (manufactured by Shin-Etsu Chemical Co., Ltd., "KBM-403", 2.5 parts by mass of a styrylsilane-based silane coupling agent (manufactured by Shin-Etsu Chemical Co., Ltd., "KBM-1403"), 0.5 parts by mass of wetting dispersant 1 (manufactured by BYK Japan K.K., "DISPERBYK-111"), 1 part by mass of wetting dispersant 2 (manufactured by BYK Japan K.K., "DISPERBYK-161"), 0.3 parts by mass of wetting dispersant 3 (manufactured by BYK Japan K.K., "DISPERBYK-2009"), 0.05 parts by mass of a surface conditioner (manufactured by BYK Japan K.K., "BYK-310"), and 0.5 parts by mass of triphenylimidazole (manufactured by Tokyo Chemical Industry Co., Ltd., curing accelerator) were mixed and diluted with methyl ethyl ketone to obtain varnish. An S glass woven fabric having a thickness of 0.1 mm was impregnated and coated with this varnish, and dried by heating at 160° C. for 3 minutes to obtain a prepreg having a resin composition content of 44.5% by mass. In this respect, the ratio [β/α] of the number of maleimide groups in the maleimide compound (β) to the number of alkenyl groups in the alkenyl-substituted nadimide (α) was 2.1. The ratio [β/α] is represented by the following calculation expression:

[β/α]=(Parts by mass of (β)/Functional group equivalent of (β))/(Parts by mass of (α)/Functional group equivalent of (α))

Example 2

5 parts by mass of the α-naphthol aralkyl-based cyanic acid ester resin obtained in Synthesis Example 1, 43.2 parts by mass of a novolac-based maleimide compound (manufactured by Daiwakasei Industry Co., Ltd., "BMI-2300"), 31.8 parts by mass of bisallylnadimide (manufactured by Maruzen Petrochemical Co., Ltd., "BANI-M"), 10 parts by mass of 4,4-bis(o-propenylphenoxy)benzophenone (manufactured by Evonik Industries AG, "Compimide TM-123"), 10 parts by mass of a biphenyl aralkyl-based epoxy resin (manufactured by Nippon Kayaku Co., Ltd., "NC-3000H"), 80 parts by mass of silica 1 (manufactured by Denka Co., Ltd., "FB-3SDC"), 120 parts by mass of silica 2 (manufactured by Admatechs Co., Ltd., "SC-5500SQ"), 2.5 parts by mass of an epoxysilane-based silane coupling agent (manufactured by Shin-Etsu Chemical Co., Ltd., "KBM-403", 2.5 parts by mass of a styrylsilane-based silane coupling agent (manufactured by Shin-Etsu Chemical Co., Ltd., "KBM-1403"), 0.5 parts by mass of wetting dispersant 1 (manufactured by BYK Japan K.K., "DISPERBYK-111"), 1 part by mass of wetting dispersant 2 (manufactured by BYK Japan K.K., "DISPERBYK-161"), 0.3 parts by mass of wetting dispersant 3 (manufactured by BYK Japan K.K., "DISPERBYK-2009"), 0.05 parts by mass of a surface conditioner (manufactured by BYK Japan K.K., "BYK-310"), and 0.5 parts by mass of triphenylimidazole (manufactured by Tokyo Chemical Industry Co., Ltd., curing accelerator) were mixed and diluted with methyl ethyl ketone to obtain varnish. An S glass woven fabric having a thickness of 0.1 mm was impregnated and coated with this varnish, and dried by heating at 160° C. for 3 minutes to obtain a prepreg having a resin composition content of 44.5% by mass ($\beta/\alpha=2.1$).

Example 3

5 parts by mass of the α-naphthol aralkyl-based cyanic acid ester resin obtained in Synthesis Example 1, 43.2 parts by mass of a novolac-based maleimide compound (manufactured by Daiwakasei Industry Co., Ltd., "BMI-2300"), 31.8 parts by mass of bisallylnadimide (manufactured by Maruzen Petrochemical Co., Ltd., "BANI-M"), 10 parts by mass of stilbene (manufactured by Tokyo Chemical Industry Co., Ltd.), 10 parts by mass of a biphenyl aralkyl-based epoxy resin (manufactured by Nippon Kayaku Co., Ltd., "NC-3000H"), 80 parts by mass of silica 1 (manufactured by Denka Co., Ltd., "FB-3SDC"), 120 parts by mass of silica 2 (manufactured by Admatechs Co., Ltd., "SC-5500SQ"), 2.5 parts by mass of an epoxysilane-based silane coupling agent (manufactured by Shin-Etsu Chemical Co., Ltd., "KBM-403", 2.5 parts by mass of a styrylsilane-based silane coupling agent (manufactured by Shin-Etsu Chemical Co., Ltd., "KBM-1403"), 0.5 parts by mass of wetting dispersant 1 (manufactured by BYK Japan K.K., "DISPERBYK-111"), 1 part by mass of wetting dispersant 2 (manufactured by BYK Japan K.K., "DISPERBYK-161"), 0.3 parts by mass of wetting dispersant 3 (manufactured by BYK Japan K.K., "DISPERBYK-2009"), 0.05 parts by mass of a surface conditioner (manufactured by BYK Japan K.K., "BYK-310"), and 0.5 parts by mass of triphenylimidazole (manufactured by Tokyo Chemical Industry Co., Ltd., curing accelerator) were mixed and diluted with methyl ethyl ketone to obtain varnish. An S glass woven fabric having a thickness of 0.1 mm was impregnated and coated with this varnish, and dried by heating at 160° C. for 3 minutes to obtain a prepreg having a resin composition content of 44.5% by mass ($\beta/\alpha=2.1$).

Example 4

5 parts by mass of the α-naphthol aralkyl-based cyanic acid ester resin obtained in Synthesis Example 1, 46 parts by mass of bismaleimide compound (manufactured by Daiwakasei Industry Co., Ltd., "BMI-70"), 29 parts by mass of bisallylnadimide (manufactured by Maruzen Petrochemical Co., Ltd., "BANI-M"), 10 parts by mass of 4,4-bis(o-propenylphenoxy)benzophenone (manufactured by Evonik Industries AG, "Compimide TM-123"), 10 parts by mass of a biphenyl aralkyl-based epoxy resin (manufactured by Nippon Kayaku Co., Ltd., "NC-3000H"), 80 parts by mass of silica 1 (manufactured by Denka Co., Ltd., "FB-3SDC"), 120 parts by mass of silica 2 (manufactured by Admatechs Co., Ltd., "SC-5500SQ"), 2.5 parts by mass of an epoxysilane-based silane coupling agent (manufactured by Shin-Etsu Chemical Co., Ltd., "KBM-403", 2.5 parts by mass of a styrylsilane-based silane coupling agent (manufactured by Shin-Etsu Chemical Co., Ltd., "KBM-1403"), 0.5 parts by mass of wetting dispersant 1 (manufactured by BYK Japan K.K., "DISPERBYK-111"), 1 part by mass of wetting dispersant 2 (manufactured by BYK Japan K.K., "DISPERBYK-161"), 0.3 parts by mass of wetting dispersant 3 (manufactured by BYK Japan K.K., "DISPERBYK-2009"), 0.05 parts by mass of a surface conditioner (manufactured by BYK Japan K.K., "BYK-310"), and 0.5 parts by mass of triphenylimidazole (manufactured by Tokyo Chemical Industry Co., Ltd., curing accelerator) were mixed and diluted with methyl ethyl ketone to obtain varnish. An S glass woven fabric having a thickness of 0.1 mm was impregnated and coated with this varnish, and dried by heating at 160° C. for 3 minutes to obtain a prepreg having a resin composition content of 44.5% by mass ($\beta/\alpha=2.1$).

Comparative Example 1

5 parts by mass of the α-naphthol aralkyl-based cyanic acid ester resin obtained in Synthesis Example 1, 49 parts by mass of a novolac-based maleimide compound (manufactured by Daiwakasei Industry Co., Ltd., "BMI-2300"), 36 parts by mass of bisallylnadimide (manufactured by Maruzen Petrochemical Co., Ltd., "BANI-M"), 10 parts by mass of a biphenyl aralkyl-based epoxy resin (manufactured by Nippon Kayaku Co., Ltd., "NC-3000H"), 80 parts by mass of silica 1 (manufactured by Denka Co., Ltd., "FB-3SDC"), 120 parts by mass of silica 2 (manufactured by Admatechs Co., Ltd., "SC-5500SQ"), 2.5 parts by mass of an epoxysilane-based silane coupling agent (manufactured by Shin-Etsu Chemical Co., Ltd., "KBM-403", 2.5 parts by mass of a styrylsilane-based silane coupling agent (manufactured by Shin-Etsu Chemical Co., Ltd., "KBM-1403"), 0.5 parts by mass of wetting dispersant 1 (manufactured by BYK Japan K.K., "DISPERBYK-111"), 1 part by mass of wetting dispersant 2 (manufactured by BYK Japan K.K., "DISPERBYK-161"), 0.3 parts by mass of wetting dispersant 3 (manufactured by BYK Japan K.K., "DISPERBYK-2009"), 0.05 parts by mass of a surface conditioner (manufactured by BYK Japan K.K., "BYK-310"), and 0.5 parts by mass of triphenylimidazole (manufactured by Tokyo Chemical Industry Co., Ltd., curing accelerator) were mixed and diluted with methyl ethyl ketone to obtain varnish. An S glass woven fabric having a thickness of 0.1 mm was impregnated and coated with this varnish, and dried by heating at 160° C. for 3 minutes to obtain a prepreg having a resin composition content of 44.5% by mass ($\beta/\alpha=2.1$).

(Measurement of Lowest Melt Viscosity of Prepreg)

1 g of a resin powder was collected as a sample from the prepreg obtained in each of Examples and Comparative Example, and the lowest melt viscosity was measured using a rheometer (manufactured by TA Instruments, "ARES-G2"). In this measurement, a disposable plate having a plate diameter of 25 mm was used, and the lowest melt viscosity was measured by heating from 40° C. to 210° C. at a heating rate of 2° C./min under conditions involving a frequency of 10.0 rad/sec and a strain of 0.1%.

(Preparation of Metal Foil Laminate)

Electrolytic copper foils having a thickness of 12 μm (manufactured by Mitsui Mining & Smelting Co., Ltd., "3EC-III") were disposed on the upper and lower sides of 1 layer or 4 layers of the prepreg obtained in each of Examples and Comparative Example, and the resultant was lamination-molded at a pressure of 30 kgf/cm$^2$ and a temperature of 220° C. for 120 minutes to obtain a copper-clad laminate having an insulating layer thickness of 0.1 mm or 0.4 mm. Desmear resistance was evaluated using the obtained copper-clad laminate.

(Evaluation of Desmear Resistance)

In order to evaluate chemical resistance in the desmear step, the copper foils were removed from each copper-clad laminate by etching. Then, the resulting sample was dipped in a swelling solution (manufactured by Atotech Japan K.K., "Swelling Dip Securiganth P") at 80° C. for 10 minutes, then dipped in a roughening solution (manufactured by Atotech Japan K.K., "Concentrate Compact CP") at 80° C. for 5 minutes, and finally dipped in a neutralizing solution (manufactured by Atotech Japan K.K., "Reduction Conditioner Securiganth P500") at 45° C. for 10 minutes. The amount of decrease in mass (% by mass) between before and after the treatment was determined. This experiment was carried out three times. The arithmetic average of the rates of decrease in mass in the 3 runs of the experiment was used as an evaluation value.

(Evaluation of Rate of Elastic Modulus Loss)

After removal of the copper foils from each copper-clad laminate by etching, the resulting sample was cut into a size of 50 mm×25 mm×8 mm. The flexural modulus was measured by assay at each of 25° C. and 250° C. using an autograph (manufactured by Shimadzu Corp., AG-Xplus) according to JIS C 6481.

From the flexural modulus (a) at 25° C. and the elastic modulus (b) at 250° C. measured by the approach described above, the rate of elastic modulus loss was calculated according to the following expression:

Rate of elastic modulus loss=[{(a)−(b)}/(a)]×100

A smaller rate of elastic modulus loss was evaluated as being better.

The evaluation results of each of Examples and Comparative Example are shown in Table 1.

TABLE 1

| | | Comparative Example 1 | Example 1 | Example 2 | Example 3 | Example 4 |
|---|---|---|---|---|---|---|
| Desmear resistance | Rate of change in mass [%] | −0.64 | −0.57 | −0.58 | −0.63 | −0.55 |
| Lowest melt viscosity of prepreg | poise | 137261 | 38146 | 92243 | 110767 | 21584 |
| Rate of elastic modulus loss | [%] | 10 | 16 | 13 | 12 | 20 |

From these results, it was confirmed at least that the sample of each Example had low melt viscosity and therefore excellent resin flow properties to thereby have excellent moldability, and was excellent in desmear resistance. The samples of Examples 1 to 3 using BMI-2300 corresponding to a novolac-based maleimide (polymaleimide) particularly exhibited a favorable rate of elastic modulus loss, as compared with the sample of Example 4 using BMI-70 corresponding to bismaleimide.

INDUSTRIAL APPLICABILITY

The resin composition, the prepreg, the resin sheet, the laminate, the metal foil-clad laminate, the insulating layer for printed circuit boards, and the printed circuit board according to the present invention can be preferably used as members for various electronics including personal computers, and communication devices.

The invention claimed is:

1. A resin composition comprising
a compound represented by the following formula (a) or the following formula (b),
an alkenyl-substituted nadimide compound, and
a maleimide compound:

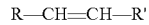
(a)

wherein R represents a phenyl group which may have one or more of an alkyl group having 1 to 6 carbon atoms, an alkoxy group, a phenoxy group, a hydroxyl group or an amino group, a naphthyl group which may have one or more of an alkyl group having 1 to 6 carbon atoms, an alkoxy group, a phenoxy group, a hydroxyl group or an amino group, or a biphenyl group which may have one or more of an alkyl group having 1 to 6 carbon atoms, an alkoxy group, a phenoxy group, a hydroxyl group or an amino group, and R' represents a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms, and

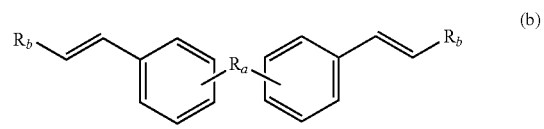
(b)

wherein $R_a$ represents a group represented by the following formula (c), and a plurality of $R_b$ moieties each independently represent a methyl group, a phenyl group, a naphthyl group, a biphenyl group, or a benzyl group, wherein each of the phenyl group, the naphthyl group, the biphenyl group and the benzyl group may have one or more alkyl groups having 1 to 6 carbon atoms:

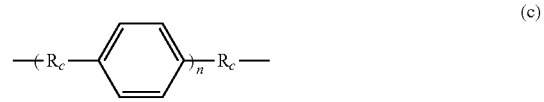
(c)

wherein each $R_c$ independently represents a methylene group, an isopropylidene group, or a substituent represented by —CO—, —O—, —S— or >$SO_2$, and n represents an integer of 0 to 5, wherein the compound represented by the formula (a) or the formula (b) comprises at least one compound selected from the group consisting of 1-propenylbenzene, 1-methoxy-4-(1-propenyl)benzene, 1,2-diphenylethene, 4-propenyl-phenol, and a compound represented by the following formula (b1):

(b1)

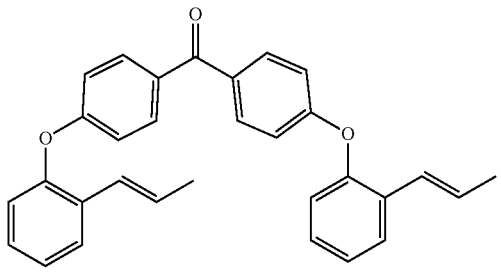

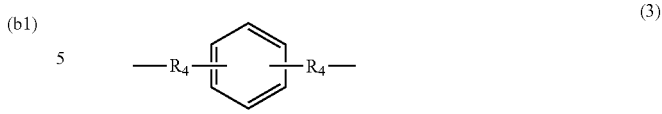

(3)

wherein each $R_4$ independently represents an alkylene group having 1 to 4 carbon atoms, or a group represented by $>SO_2$.

2. The resin composition according to claim 1, wherein the resin composition comprises, as the alkenyl-substituted nadimide compound, a compound represented by the following formula (4) and/or (5):

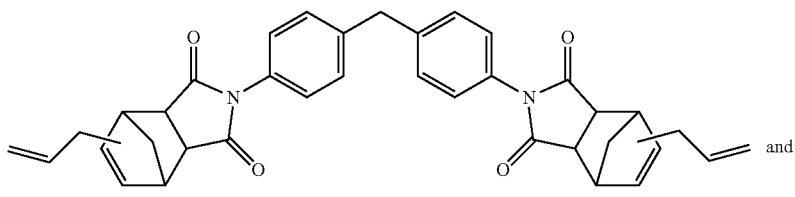

and (4)

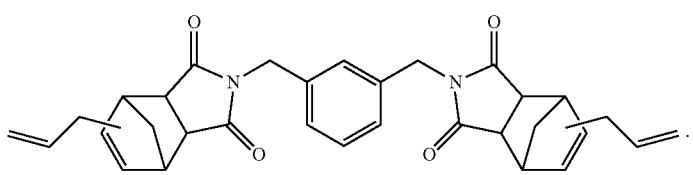

(5)

and
wherein the resin composition comprises, as the alkenyl-substituted nadimide compound, a compound represented by the following formula (1):

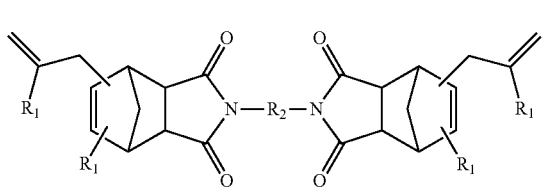

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following formula (2) or (3):

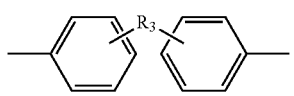

(2)

wherein $R_3$ represents a methylene group, an isopropylidene group, or a substituent represented by —CO—, —O—, —S—, or $>SO_2$, and 3. The resin composition according to claim 1, wherein the resin composition comprises, as the maleimide compound, at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, polytetramethylene oxide-bis(4-maleimidobenzoate), and a maleimide compound represented by the following formula (6):

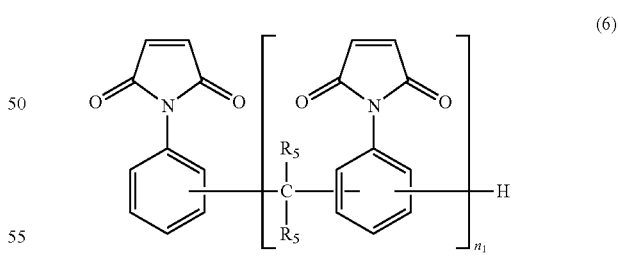

(6)

wherein each $R_5$ independently represents a hydrogen atom or a methyl group, and $n_1$ represents an integer of 1 or more.

4. The resin composition according to claim 1, further comprising a cyanic acid ester compound.

5. The resin composition according to claim 4, wherein the resin composition comprises, as the cyanic acid ester compound, a compound represented by the following formula (7) and/or (8):

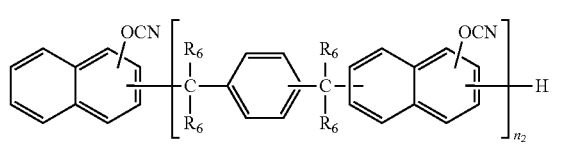

wherein each $R_6$ independently represents a hydrogen atom or a methyl group, and $n_2$ represents an integer of 1 or more, and

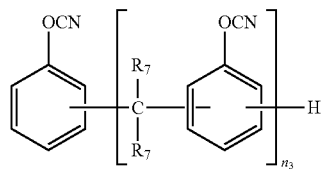

wherein each $R_7$ independently represents a hydrogen atom or a methyl group, and $n_3$ represents an integer of 1 or more.

6. The resin composition according to claim 1, further comprising an inorganic filler.

7. The resin composition according to claim 6, wherein the resin composition comprises, as the inorganic filler, at least one selected from the group consisting of silica, alumina, aluminum nitride, and boron nitride.

8. A printed circuit board comprising an insulating layer and a conductor layer formed on the surface of the insulating layer, wherein the insulating layer comprises the resin composition according to claim 1.

9. A metal foil-clad laminate comprising:
at least one selected from the group consisting of
i) a prepreg comprising a base material and the resin composition according to claim 1, the base material being impregnated or coated with the resin composition and
ii) resin sheet comprising a support and the resin composition according to claim 1, the support being coated with the resin composition; and
a metal foil disposed on one side or both sides of the at least one selected from the group consisting of the prepreg and the resin sheet,
wherein the metal foil-clad laminate comprises a cured product of the resin composition contained in the at least one selected from the group consisting of the prepreg and the resin sheet.

* * * * *